United States Patent [19]

Knippenberg

[11] 4,099,865

[45] Jul. 11, 1978

[54] METHOD AND APPARATUS FOR MAKING COLOR SEPARATIONS FROM A COLOR TRANSPARENCY

[76] Inventor: Gerald V. Knippenberg, 5805 Stuart Ave. South, Edina, Minn. 55436

[21] Appl. No.: 780,433

[22] Filed: Mar. 23, 1977

[51] Int. Cl.² .................. G03B 27/54; G03B 27/32
[52] U.S. Cl. ...................................... 335/37; 355/77
[58] Field of Search ............................. 355/32–38, 355/18, 19, 64, 67, 68, 70, 71, 77, 125, 132; 354/354

[56] References Cited

U.S. PATENT DOCUMENTS

| | | | |
|---|---|---|---|
| 2,206,396 | 7/1940 | Glass et al. | 355/19 |
| 2,415,424 | 2/1947 | Gaebel | 355/64 X |
| 2,701,196 | 2/1955 | Conrad | 355/32 X |
| 2,985,062 | 5/1961 | Clapp | 355/37 |
| 3,143,921 | 8/1964 | Russell | 355/71 X |
| 3,199,402 | 8/1965 | Hunt et al. | 355/37 |
| 3,241,441 | 3/1966 | Barbour et al. | 355/37 X |
| 3,424,530 | 1/1969 | Leonhart | 355/18 X |
| 3,682,539 | 8/1972 | Yamaji et al. | 355/37 X |
| 3,739,700 | 6/1973 | Yost | 354/354 |
| 3,841,752 | 10/1974 | Terajima et al. | 355/37 X |

FOREIGN PATENT DOCUMENTS

| | | | |
|---|---|---|---|
| 71,115 | 3/1959 | France | 355/32 |
| 805,891 | 12/1958 | United Kingdom | 355/32 |

*Primary Examiner*—Donald A. Griffin
*Attorney, Agent, or Firm*—Schroeder, Siegfried, Ryan, Vidas & Steffey

[57] ABSTRACT

The method of making color separations from masked colored transparencies which involves exposure of the transparency from separate light sources each having different colored light outputs with limited spectral band widths and from light sources which approach in size the physical size of the transparency to significantly reduce the power requirements for the light sources. The improved apparatus includes means for mounting a plurality of such light sources within a copy holder or associated therewith to selectively direct light having energy emission over the limited spectral band width onto the masked transparencies for exposing the films sequentially in the making of color separations.

12 Claims, 6 Drawing Figures

METHOD AND APPARATUS FOR MAKING COLOR SEPARATIONS FROM A COLOR TRANSPARENCY

BACKGROUND OF INVENTION

The present method of making color negatives, transparencies and prints, require the use of color compensating filters to control the attenuation principally of the red, green and blue parts of the light spectrum to insure color balance in pictures recorded on colored film and to compensate for the deficiencies in the spectrual quality of the light sources. The present methods used for the making of such negatives, transparencies or prints utilize a white light source and convert the same to light sources having different wave lengths which are used to simultaneously expose the various color emulsions on the film to match the quality of light for which the color film is balanced. Such light sources may be single or plural lights and employ a variety of filtering arrangements including compensating filters, light balancing and conversion filters and diffusion filters for proper exposure of the film.

In the making of color spearations for the printing of color pictures, it is necessary to make a plurality of sequential exposures of separate films with different light sources so that the proper amounts of printing ink may be applied to the resulting picture for proper reproduction and color balance. In the making of color separations, it is necessary for printing to make half tone negatives for the different printing inks and because of the inefficiency of printing inks, it is desirable to mask the transparency in the making of a separation, to bring the range of density of the transparency into one which is capable of printing on paper and to correct for hue error. Different colored light is used to expose each film for each separation and the present method employs a single light source with conversion filtering to insure proper exposure of the film for each color separation. At the present time, the filtering required the densities encountered and mechanics involved in making color separations requires the use of high powered large lights which generate vast amounts of unwanted heat. This results from the nature of the original source, the absorption of a large portion of the radiant energy spectrum through filtering, the use of half tone screens, and the density of the transparency itself. Further, since small transparencies are generally used and enlarging takes place, the problem of providing sufficient light for proper exposure of the film is compounded.

SUMMARY OF INVENTION

The present invention is directed to an improved method and apparatus for making color separations from a color transparency. This improved method of making color transparencies from color separations involves the use of different light sources, each having limited energy emission over a different spectral band width for making the several different film separations used in the printing of color pictures in a printing process. The light sources have sharply defined spectral band widths which reduce or eliminate the filtering requirements to significantly reduce power requirements to the light sources. Further, the light sources are reduced in physical size to closely approach the size of the transparency such that the amount of energy input to the light sources is significantly reduced. The reduction in the size of the light source maximizes the usage of the light energy transmitted therefrom. The light energy may be directed through the transparency or reflected from non-transparent originals to provide the imaged light which illuminates the film for the separation. The improved method is practiced by an apparatus, gallery or dark room camera or enlarger which provides for the mounting of plural light sources, each having limited energy emissions over different spectral band width, in association with a copy holder of a camera or enlarger. This provides for sequential illumination of the masked transparency and the directing of imaged light therefrom through a focusing lens and onto the separate films in a sequence of exposures to make the separate film separations used in the color printing process. The improved apparatus and method may employ some filtering to further define the light and it utilizes a masking of the transparency or reflection copy to reduce the density of the same to bring the transparency or reflection copy within printing ranges. Direct screen separations may be made by employing half tone screens in contact with the film during exposure of the same. The physical size of the individual light sources relative to the size of the transparency opening in the copy holder insures a maximum usage of the light energy from the individual light sources and the adjustability of the light sources within the copy holder facilitate a simplified usage of the apparatus in practicing the method of making separate color separations. The reduction in the amount of energy input into the light sources significantly reduces the cost of operation of the equipment and the disadvantages incident with the generation of heat therefrom.

DESCRIPTION OF PREFERRED EMBODIMENT

Figure 1:
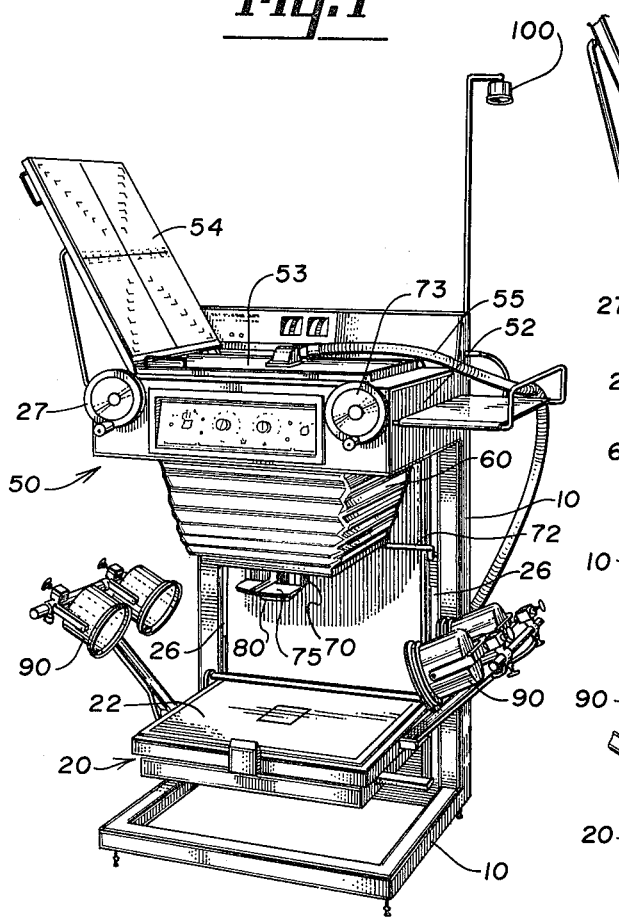
FIG. 1 is a perspective view of an improved dark room camera employing the improved method for making color separations from masked transparencies.
Figure 2:
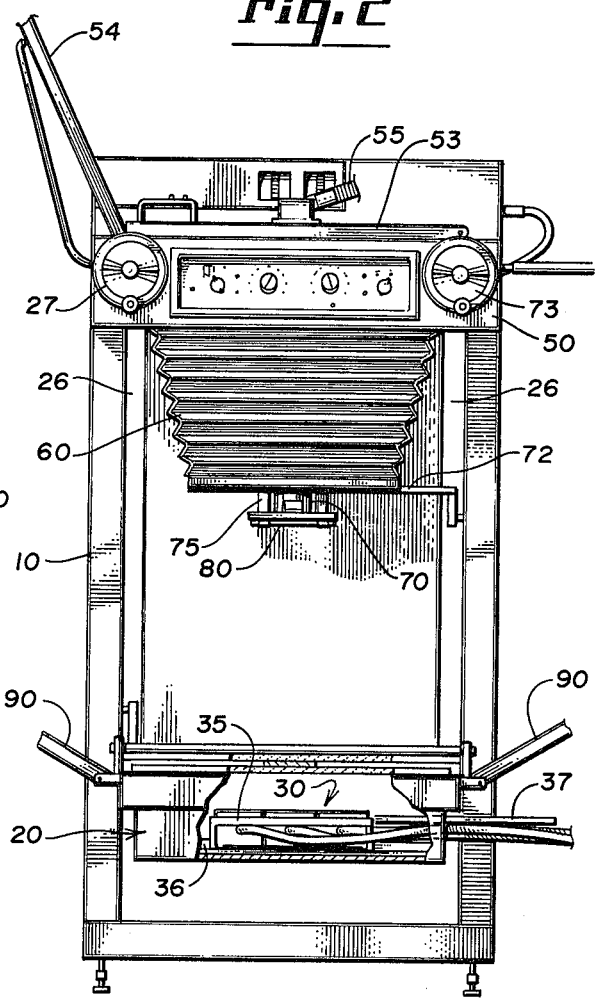
FIG. 2 is an elevation view of the camera of FIG. 1.

My improved method and apparatus for making color separations from masked color transparencies will be best seen in the perspective view in FIG. 1 and the elevation view in FIG. 2. It discloses a dark room type camera in which light is reflected from or directed through an imaged copy which may be a transparency or opaque original and through a focusing lens and bellows to a film holder member for holding film from which the color separations are made. Thus, in FIGS. 1 and 2, numeral 10 indicates generally the frame of the camera which may be an upstanding vertical unit or horizontal unit as desired. It includes a copy holder member, indicated generally at 20, which is a box like structure having a tiltable glass top 22 on the same with a reflective surface 24 on the box which encloses a plurality of light sources to be hereinafter identified. The reflective surface has an opening 25 therein through which light may be directed onto a transparency when the light sources are positioned on the copy holder member. If reflected light is used, the reflective surface 24 is complete. Light is directed through the transparency to a focusing lens to be hereinafter defined. Copy holder member 20 includes a plurality of light sources, indicated generally at 30, which are housed within the box like structure of the copy holder member and exposed through the opening 25 of the reflective surface. Copyholder member 20 is adjustably mounted in frame through guide channels 26 and is movable through cabling (not shown) which is adjusted by an adjusting control 27 mounted in the film holder member, to be hereinafter described.

Also positioned in the frame 10 is a film holder member, indicated generally at 50, which is rigidly secured to the frame and includes an enclosing frame structure 52 having a pair of doors 53, 54 thereon. Door 53 is a film holder door having a vacuum air supply connected thereto through a hose indicated at 55; the door has holes in the opposite surface to apply suction to secure the film and screen, if used, thereto. Door 54 is a ground glass door which is positioned over the opening of frame structure communicating with the bellows 60 which is connected to the frame structure 52 and is connected to a focusing lens 70 of the other extremity thereof. The ground glass door 54 provides a means for checking of the image from the transparency for focusing and location of the film within the film holder member. Focusing lens 70 is connected through an adjustable frame 72 slidably mounted in guide channels 26 on frame 10. The frame 72 is connected through cabling (not shown) to adjusting wheel 73 in film holder member 50 to adjust the position of a focusing lens with respect to the film holder member and transparency for desired focusing of the imaged light on the film and to provide whatever enlargement is necessary. The focusing lens may include mounting clips 75 thereon on which suitable filter members, indicated generally at 80, may be positioned in front of the focusing lens to sharpen the imaged light on to the film where desired or filters may be positioned over light sources 31, 33.

The light sources 30 within a copy holder member are individual blue, green, and red light sources or lamps 31, 32, 33 covering energy outputs of from 400 to 500 nanometers wave length, 500 to 600 nanometers wave length and 600 to 700 nanometers wave length, respectively. Thus, the lamps 31, 32, and 33 representing such light sources are physically small in size, being slightly larger than the opening 25 in the reflective surface of the copy holder and are individually mounted on a frame 35 which is slidably mounted on rails 36 in the base of the copy holder member. An adjustable handle 37 projecting through the wall of a copy holder member permits movement of the frame and hence the respective lights to bring the same beneath the opening 25 in the reflective surface of the copy holder member and direct the major portion of the output of the respective light source through the transparency mounted in the opening. Suitable wiring 40 is connected to each light which will be selectively illuminated as the respective lights are positioned within the copy holder member to direct light therefrom through the opening in the reflective surface of the copy holder member. These are positioned close to the copy plane so that maximum use is made of the energy output of the light source and conversion of the same to imaged light. The respective wattage of such light sources is from the range of 50 to 100 watts which is significantly less than the normal requirements of a conventional white light source with filtering which has a several kilowatt watt input as presently used in making color separations. Similarly, the amount of heat energy generated by the reduced wattage of the respective lights 31 – 33 over the conventional white light source is significantly less than that generated by conventional light sources and greatly reduces unwanted heat generation and the resultant detriment to equipment and transparencies. For focusing the image on the ground glass top 54 of the film holder member 50, the lamps 30 or reflective lamp 90, attached to the copy holder member may be focused on the transparency or opaque copy respectively to illuminate the ground glass door for image check and location of film. The vacuum supply for door 53 applies a source of vacuum to the film and hence holds the film and screen, if used, against the same when light is directed from the copy holder member through the transparency and focusing lens on to the film. In addition, the camera may include a suitable flash lamp holder 100 mounted on the frame and positioned over the film holder door 53 when opened to expose the film to flash light for suitable shadow exposure.

Figure 3:
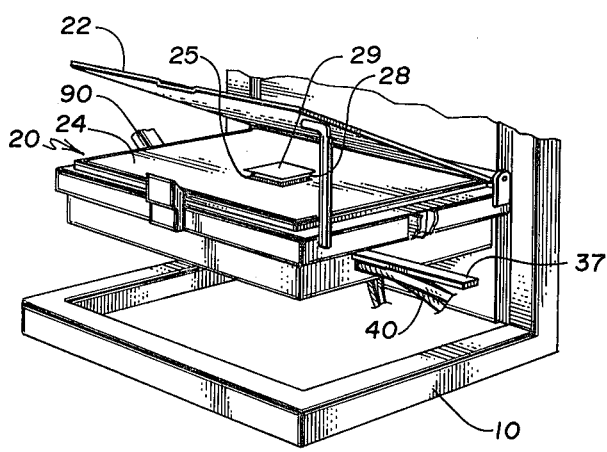
FIG. 3 is a perspective view of the copy holder of the camera of FIG. 1.
Figure 4:
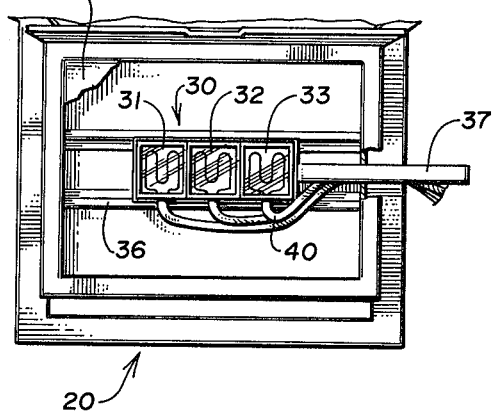
FIG. 4 is a plan view of the copy holder with the cover removed to show the positioning of the light sources therein; and, FIG. 5 is an alternate embodiment of the light sources of the camera of FIG. 1; and, FIG. 6 is a schematic view of a camera for processing the improved method.

Thus, as shown in FIGS. 3 and 4, the copy holder member will open to permit the mounting of a transparency therein over the opening 25 in the reflective surface or placement of opaque copy. Thereafter, the glass top 22 is closed to hold the transparency or reflection copy in position thereon. In normal operation, the color transparency and a black and white transparency, used to mask the color transparency, will be located in the copy holder member to permit the direction of colored light therethrough directing the imaged light onto the focusing lens and the film in the film holder member 50. Separate exposures will be made with each of the colored light sources 31 – 33, to expose the separate films in the film holder member to light emissions having different spectral band width. Where direct screen separations are used, the imaged light is modulated through a half tone screen before being directed onto the film, the half tone screen being in direct contact therewith. The lights 31 – 33 are adjustable within the copy holder member by positioning the adjusting handle 37 with respect to the copy holder member to bring each light respectively beneath the opening 15 in the reflective surface 24 of the copy holder member.

Figure 5:
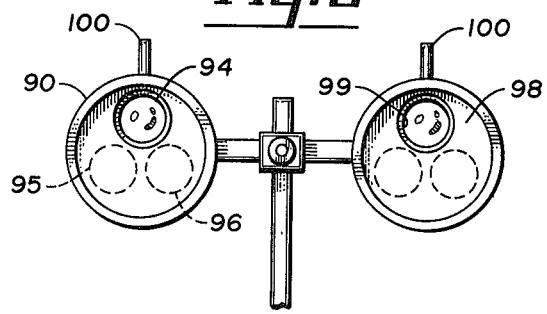

If reflected light is to be used for providing the imaged light from opaque copy, the colored lights are positioned in the reflective light holder 90. Thus, as indicated in FIG. 5, each reflective light holder 90 has a plurality of light sources 94, 95, 96 therein with a suitable cover 98 having an opening 99 therein which may be adjusted relative to the lights to permit the passage of light from one of the sources therethrough. The cover or mask 98 will be adjusted by a handle 100 similar to the handle 36 in the copy holder member to position the opening 99 in front of the respective colored light from which the separation is to be made for proper exposure of opaque copy. It will be understood that only one light will be energized at one time and the positioning of the light holder with respect to the copy holder member may be adjusted to provide for the desired amount of light to be reflected through a focusing lens.

Figure 6:
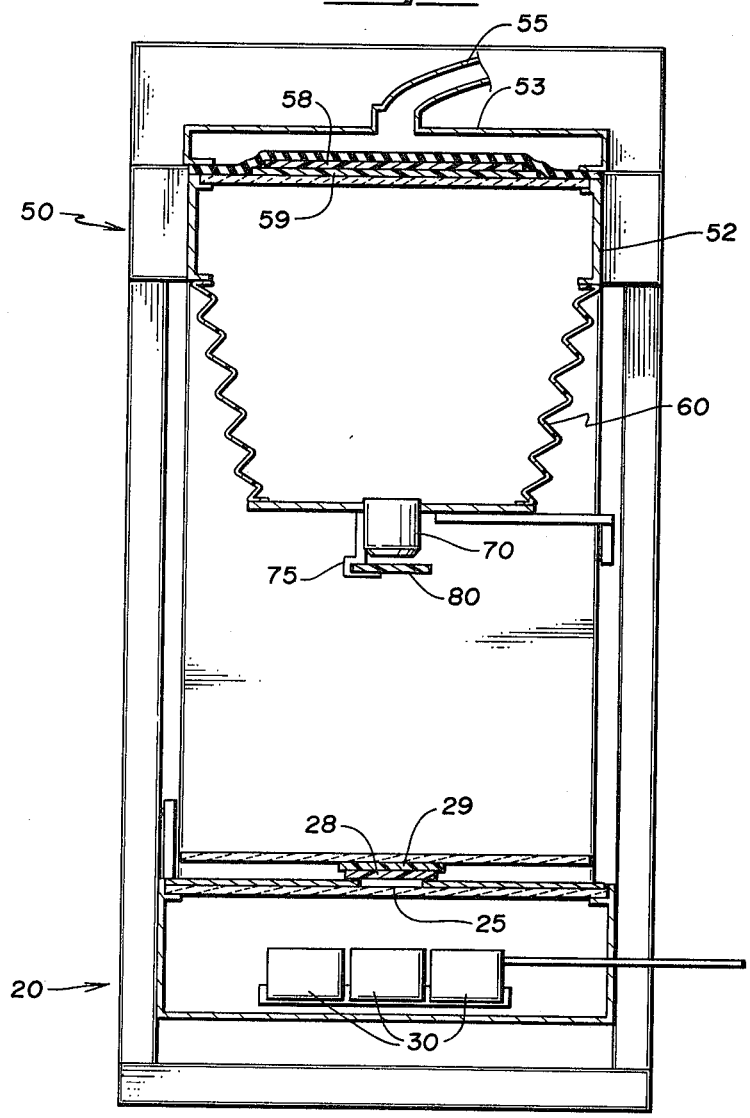

In the improved method of making color separations, a transparency 28, as shown schematically in FIG. 6, from which the separations are to be made is first masked with a black and white transparency 29 having the same image thereon. This significantly reduces the density of the film to be compatable with the limits of the printing process. Light from one of the colored sources 30 or 90 having an energy emission covering a limited spectral band width is then directed through the transparency or reflected from the opaque copy to produce an imaged light therefrom. Such imaged light is directed through a focusing lens 70 onto the film from which the separation is to be made. This will provide a proper sized image on the film. The individual films 58 may or may not have the same spectral sensitivity and speed and the amount of exposure of the light sensitive emulsion thereon will be determined by the quality of the imaged light being directed thereon. The steps of making the individual separations are repeated using light sources 31 – 33 having energy emissions with different spectral band widths, that is a different colored light, on to a separate film 58 for proper exposure of the emulsion thereon with the different light sources. Such steps will be repeated until three or four separations are made each from the individual light sources and with exposure of the respective films to the light sources with imaged light therefrom. One of these four may be made by multiple exposure to two or three of the light sources 31 – 33. Where continuous tone separations are being made, the individual separation films are subsequently photographed through half tone screens. However, direct screen separations may be made at the time of exposure of the individual films by placing a half tone screen 59 in contact with the film for the separation at the time each of the exposures steps are made. The use of low wattage special lights each having a light energy output limited to a spectral band width provides for exposure of the film in the making of a colored separation from a masked transparency with a minimum amount of power input to the light sources. This significantly reduces the power requirements of the camera and the attendent heat problems generated by the larger sized light sources previously used.

In considering the invention it should be remembered that this disclosure is illustrative only and the scope of the invention should be determined by the appended claims.

What I claim is:

1. A method for making color separations from masked color transparencies comprising: masking a color transparency with a black and white transparency having the same image thereon; directing a light source having a limited spectral band width onto the masked transparency to produce imaged light therefrom; directing the imaged light onto a film which has a predetermined color emulsion thereon responsive to the light having a limited spectral band width to expose the film emulsion to the imaged light; and repeating the steps using a light source having a limited spectral band width which is different from the first named light source and using a film having an emulsion which responds to the light source having the different limited spectral band width to produce separate films exposed to the imaged light having the differing spectral band widths.

2. The method of claim 1 in which the steps are repeated for three different light sources to make three film exposures.

3. The method of claim 2 in which the light sources are blue light having an energy output of 400 to 500 nanometers wave length, green light with an energy output from 500 to 600 nanometers wave length and red light with an energy output of 600 to 700 nanometers wave length.

4. The method of claim 1 in which the films have the same or different emulsion thereon.

5. The method of claim 1 in which the light source having the limited spectral band width is directed through the masked transparency.

6. The method of claim 5 in which the imaged light which has passed through to the film from the masked transparency is filtered with a filter which absorbs light energy outside of the limited spectral band width of the light source.

7. The method of claim 6 in which the imaged light is directed to the film through a half tone screen.

8. The method of claim 1 in which each light source is disposed closely adjacent to and has a dimensional size closely approaching the physical dimensions of the masked transparency.

9. A dark room camera for making color separations comprising: a frame, a copy holder member slidably mounted on the frame near one end thereof, said copy holder member having a reflective copy board and a mounting for an imaged copy with an opening therein corresponding with the size of the imaged copy, a light source associated with the copy holder member to direct light onto the imaged copy and to produce imaged light therefrom, a film holder member rigidly secured to the other end of said frame, a focusing lens positioned between the film holder member and the copy holder and connected to the film holder member by an expandable bellows which encloses the area between the lens and the film holder member to direct light through the lens to said film holder member, said focusing lens being mounted on the frame to be adjustable toward and away from said film holder member, said light source including a plurality of lights each generating radiant energy having a limited and different spectral wave length; means mounting said light source on said copy holder member for adjustment relative thereto so that only one of said lights is in a position to illuminate the imaged copy in the copy holder member at any one time, said lights being mounted on a frame within the copy holder member and being slidably mounted within the copy holder member to adjustably position each light selectively adjacent the opening therein, and means for adjustably positioning the light mounting frame with respect to the copy holder member from without said member to transmit light through the imaged copy mounted on the copy holder member.

10. The dark room camera of claim 9 in which the light source is comprised of red, green and blue lights which are selectively positioned and energized.

11. The dark room camera of claim 9 in which each of said lights has a physical size approximately equal to the dimensions of the opening in the copy holder member in which the imaged copy is mounted.

12. The dark room camera of claim 9 and including means for removably mounting filters between the lights and the focusing lens facing the copy holder member.

* * * * *

UNITED STATES PATENT AND TRADEMARK OFFICE
CERTIFICATE OF CORRECTION

PATENT NO. : 4,099,865
DATED : July 11, 1978
INVENTOR(S) : Knippenberg, Gerald V.

It is certified that error appears in the above-identified patent and that said Letters Patent are hereby corrected as shown below:

Column 1, line 24, "spearations" should be --separations--.

Signed and Sealed this

Sixteenth Day of January 1979

[SEAL]

Attest:

RUTH C. MASON
*Attesting Officer*

DONALD W. BANNER
*Commissioner of Patents and Trademarks*